(12) United States Patent
Chen et al.

(10) Patent No.: US 10,304,947 B1
(45) Date of Patent: May 28, 2019

(54) SMOOTHING SURFACE ROUGHNESS OF III-V SEMICONDUCTOR FINS FORMED FROM SILICON MANDRELS BY REGROWTH

(71) Applicant: INTERNATIONAL BUSINESS MACHINES CORPORATION, Armonk, NY (US)

(72) Inventors: Tze-Chiang Chen, Yorktown Heights, NY (US); Cheng-Wei Cheng, White Plains, NY (US); Sanghoon Lee, Mohegan Lake, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/827,607

(22) Filed: Nov. 30, 2017

(51) Int. Cl.
| | |
|---|---|
| *H01L 27/088* | (2006.01) |
| *H01L 29/66* | (2006.01) |
| *H01L 29/78* | (2006.01) |
| *H01L 21/02* | (2006.01) |
| *H01L 29/786* | (2006.01) |
| *H01L 21/8234* | (2006.01) |
| *H01L 21/033* | (2006.01) |

(52) U.S. Cl.
CPC .. *H01L 29/66818* (2013.01); *H01L 21/02164* (2013.01); *H01L 29/785* (2013.01); *H01L 29/78684* (2013.01); *H01L 21/02592* (2013.01); *H01L 21/0334* (2013.01); *H01L 21/823431* (2013.01)

(58) Field of Classification Search
CPC ............. H01L 29/66818; H01L 29/785; H01L 29/78684; H01L 21/02164; H01L 21/02592; H01L 21/0334; H01L 21/823431

USPC ........................................................ 257/401
See application file for complete search history.

(56) References Cited

U.S. PATENT DOCUMENTS

| | | | |
|---|---|---|---|
| 6,489,636 B1 | 12/2002 | Goetz et al. | |
| 8,198,178 B2 | 6/2012 | Heikman et al. | |
| 8,617,945 B2 | 12/2013 | Hudait et al. | |
| 8,962,453 B2 | 2/2015 | Wunnicke et al. | |
| 9,129,863 B2 | 9/2015 | Caimi et al. | |
| 9,406,566 B1 | 8/2016 | Cheng et al. | |
| 9,543,323 B2 * | 1/2017 | Cheng .................. | H01L 27/1211 |
| 9,646,827 B1 | 5/2017 | Chakraborty et al. | |
| 2017/0047399 A1 | 2/2017 | Lee et al. | |
| 2017/0104086 A1 | 4/2017 | Lee et al. | |

FOREIGN PATENT DOCUMENTS

WO     2015/147858 A1     10/2015

OTHER PUBLICATIONS

Dai et al., "Novel Heterogeneous Integration Technology of III-V Layers and InGaAs FinFETs to Silicon," Advanced Functional Materials. vol. 24. Issue 28. Jul. 23, 2014. pp. 4420-4426.

\* cited by examiner

*Primary Examiner* — Tu-Tu V Ho
(74) *Attorney, Agent, or Firm* — Tutunjian & Bitetto, P.C.; Vazken Alexanian

(57) ABSTRACT

A method of forming a III-V semiconductor vertical fin is provided. The method includes forming a fin mandrel on a substrate, forming a spacer layer on the substrate surrounding the fin mandrel, forming a wetting layer on each of the sidewalls of the fin mandrel, forming a fin layer on each of the wetting layers, removing the fin mandrel, removing the wetting layer on each of the fin layers, and forming a fin layer regrowth on each of the sidewalls of the fin layers exposed by removing the wetting layer from each of the fin layers.

15 Claims, 10 Drawing Sheets

SMOOTHING SURFACE ROUGHNESS OF III-V SEMICONDUCTOR FINS FORMED FROM SILICON MANDRELS BY REGROWTH

BACKGROUND

Technical Field

The present invention generally relates to alleviating surface roughness on grown III-V semiconductor fins, and more particularly to epitaxially growing III-V semiconductor on the rough mandrel growth face of III-V semiconductor fins.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a III-V semiconductor vertical fin is provided. The method includes forming a fin mandrel on a substrate. The method further includes forming a spacer layer on the substrate surrounding the fin mandrel. The method further includes forming a wetting layer on each of the sidewalls of the fin mandrel. The method further includes forming a fin layer on each of the wetting layers. The method further includes removing the fin mandrel, removing the wetting layer on each of the fin layers, and forming a fin layer regrowth on each of the sidewalls of the fin layers exposed by removing the wetting layer from each of the fin layers.

In accordance with another embodiment of the present invention, a method of forming a III-V semiconductor vertical fin is provided. The method includes forming a fin mandrel on a substrate. The method further includes forming a spacer layer on the substrate surrounding the fin mandrel. The method further includes forming a wetting layer on each of the sidewalls of the fin mandrel. The method further includes forming a fin layer on each of the wetting layers, where the fin layer is a binary or ternary III-V semiconductor material. The method further includes removing the fin mandrel and removing the wetting layer on each of the fin layers. The method further includes forming a fin layer regrowth on each of the sidewalls of the fin layers exposed by removing the wetting layer from each of the fin layers, and forming a dummy gate layer over a middle section of a vertical fin including the fin layer regrowth and the fin layer.

In accordance with yet another embodiment of the present invention, a III-V semiconductor vertical fin device is provided. The III-V semiconductor vertical fin device includes a spacer layer on a substrate, wherein the material of the spacer layer is a flowable oxide, a vertical fin on the spacer layer, where the vertical fin is a binary or ternary III-V semiconductor material, and a gate structure over a middle section of the vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to growing III-V semiconductor fins on a wetting layer, removing the wetting layer, and growing additional III-V semiconductor material to smooth the rough surface exposed by removing the wetting layer.

Embodiments of the present invention also relate generally to smoothing the rough face of a III-V semiconductor fin by additional epitaxial growth of the III-V semiconductor fin. III-V semiconductor fins grown on (111) silicon mandrel sidewalls can have excessively rough surfaces at the Si/III-V semiconductor interface that can reduce and/or limit electron transport properties of subsequently fabricated devices. The Si/III-V interface can be significantly rougher than the exposed growth front of the fin.

Embodiments of the present invention also relate generally to smoothing the rough face of a III-V semiconductor fin by growing the additional III-V material before replacement of a dummy gate structure. Thick III-V semiconductor fins can be thinned to a final width by using a digital etch (e.g., a plasma oxidation and acid rinse).

Exemplary applications/uses to which the present invention can be applied include, but are not limited to: Complementary metal-oxide-semiconductor devices and static random access memory devices, where the present invention can be applied to transistors having high speed or lower power usage in the logic and memory devices.

It is to be understood that aspects of the present invention will be described in terms of a given illustrative architecture; however, other architectures, structures, substrate materials and process features and steps can be varied within the scope of aspects of the present invention.

Figure 1:
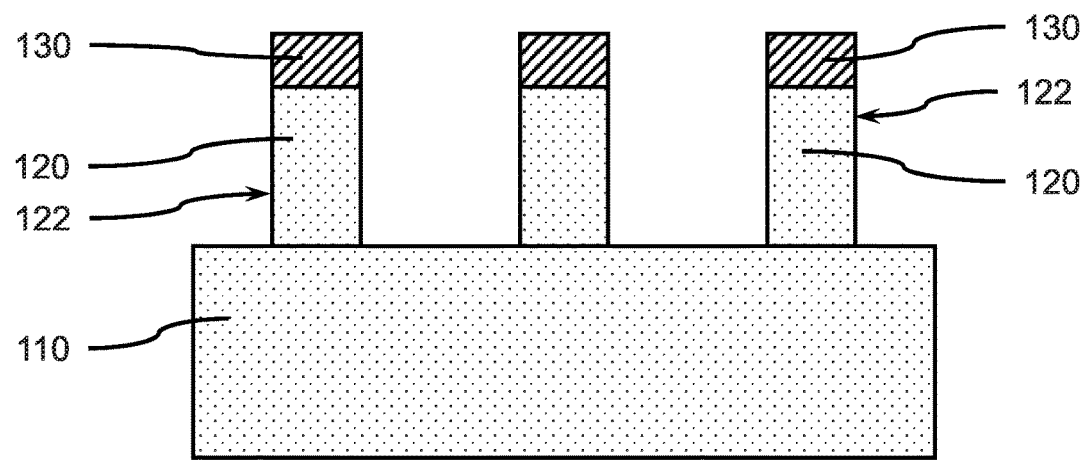
FIG. 1 is a cross-sectional side view showing a plurality of fin mandrels formed on a substrate and a mandrel template on each fin mandrel, in accordance with an embodiment of the present invention.

Referring now to the drawings in which like numerals represent the same or similar elements and initially to FIG. 1, a cross-sectional side view of a plurality of fin mandrels formed on a substrate and a mandrel template on each fin mandrel is shown, in accordance with an embodiment of the present invention.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)). In one or more embodiments, the substrate can be a single crystal silicon wafer.

The active semiconductor layer can be a crystalline semiconductor, for example, a IV or IV-IV semiconductor (e.g., silicon (Si), silicon carbide (SiC), silicon-germanium (SiGe), germanium (Ge)), or a III-V semiconductor (e.g., gallium-arsenide (GaAs), indium-phosphide (InP), indium-antimonide (InSb)). In various embodiments, substrates with crystal structures similar to silicon single crystal that can form (111) crystal planes can be used.

In one or more embodiments, one or more fin mandrels 120 can be formed on the substrate 110. The fin mandrels 120 can be formed from the substrate by masking portions of the substrate with mandrel templates 130 having the predetermined dimensions of the fin mandrel, and etching the substrate using a crystallographic wet etch, such as tetramethyl ammonium hydroxide (TMAH)), that can etch essentially straight sidewalls 122 for the fin mandrels 120, or a combination of a directional etch (e.g., Reactive Ion Etch (RIE)) and crystallographic wet etch. The crystallographic wet etch can be used to obtain a smooth face for epitaxial growth, where the (111) crystal face can be atomically smooth.

In various embodiments, the mandrel templates 130 can be a hardmask, for example, silicon oxide (SiO), silicon nitride (SiN), silicon oxynitride (SiON), silicon boronitride (SiBN), silicon carbonitride (SiCN), silicon borocarbonitride (SiBCN), or a combination thereof.

In various embodiments, the fin mandrels 120 can be single crystal silicon, where the fin mandrels 120 are formed from a single crystal silicon substrate 110. The mandrel templates 130 and fin mandrels 120 can be aligned with the crystal planes of the single crystal substrate, such that the exposed faces of the sidewalls 122 of the fin mandrels 120 are {111} silicon crystal faces.

Figure 2:
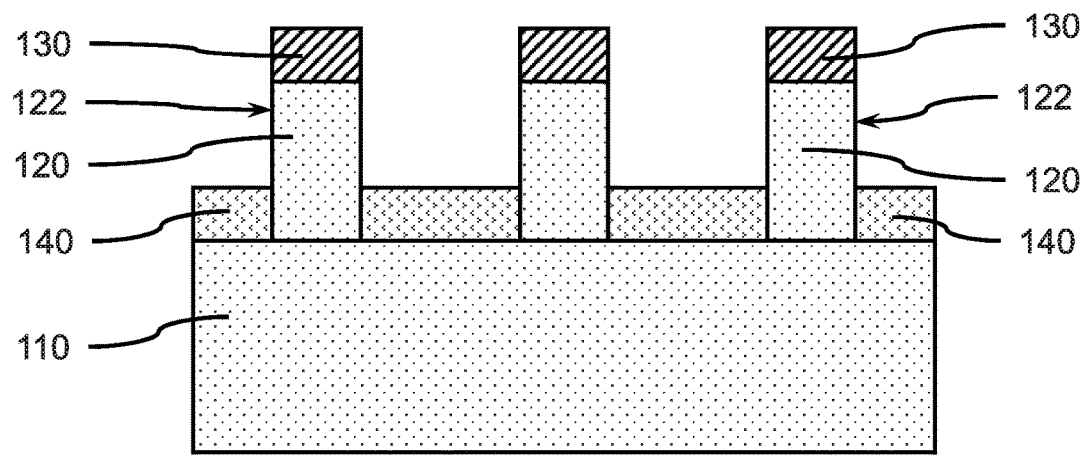
FIG. 2 is a cross-sectional side view showing a spacer layer between each pair of the plurality of fin mandrels, in accordance with an embodiment of the present invention.

FIG. 2 is a cross-sectional side view showing a spacer layer between each pair of the plurality of fin mandrels, in accordance with an embodiment of the present invention.

In one or more embodiments, a spacer layer 140 can be formed on the exposed surface of the substrate 110, where the spacer layer 140 can be between adjacent pairs of the fin mandrels 120. The spacer layer can surround each of the fin mandrels on the substrate 110.

In various embodiments, the spacer layer 140 can be made of a dielectric material, including, but not limited to a flowable oxide (e.g., hydrogen silsesquioxane (HSQ)) or a silicon oxide (SiO). The flowable oxide can be blanket deposited on the substrate 110, mandrel templates 130, and fin mandrels 120, and flowable oxide extending above the mandrel templates 130 removed using a chemical-mechanical polishing (CMP). The silicon oxide can be formed using a high density plasma (HDP) and excess silicon oxide removed using CMP. The spacer layer 140 can be recessed to a predetermined height by a controlled, selective etch to expose a predetermined height of the fin mandrel sidewalls 122.

In various embodiments, the fin mandrels 120 can have exposed sidewalls 122 with a height in the range of about 30 nm to about 70 nm, or in the range of about 30 nm to about 50 nm, or in the range of about 50 nm to about 70 nm, after recessing the spacer layer 140. The exposed fin mandrel sidewalls can have a (111) crystal face.

Figure 3:
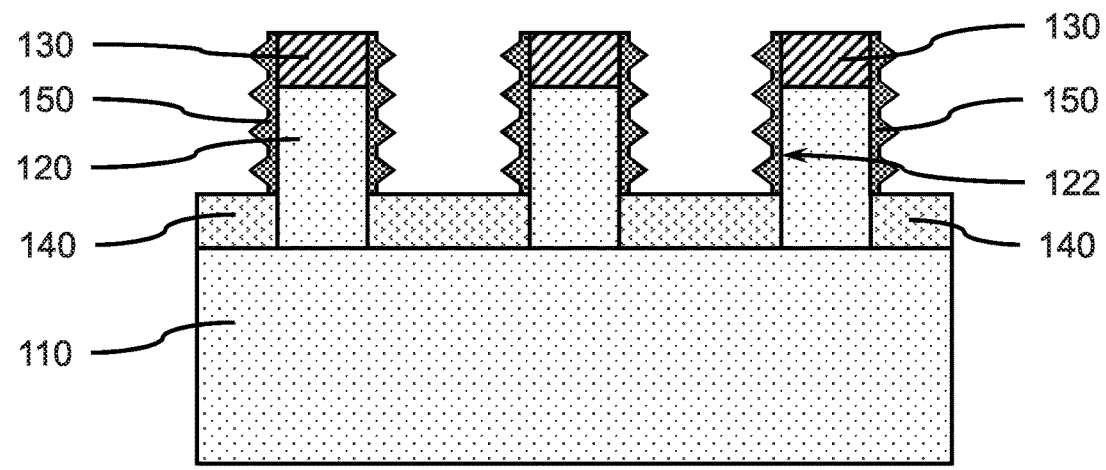
FIG. 3 is a cross-sectional side view showing a wetting layer on the sidewalls of each fin mandrel and mandrel template, in accordance with an embodiment of the present invention.

FIG. 3 is a cross-sectional side view showing a wetting layer on the sidewalls of each fin mandrel and mandrel template, in accordance with an embodiment of the present invention.

In one or more embodiments, a wetting layer 150 can be formed on the exposed sidewalls 122 of the one or more fin mandrels 120, where the exposed sidewalls 122 can be {111} crystal faces. The wetting layer 150 can be formed by a metal-organic chemical vapor deposition (MOCVD) or atomic layer deposition/atomic layer epitaxy (ALD/ALE). In various embodiments, the wetting layer 150 forms on the exposed sidewalls 122 of the one or more fin mandrels 120 without forming on the exposed top surface of the spacer layer 140. The wetting layer 150 may form on the top surfaces of the mandrel templates 130, but not on the surface of the spacer layer 140.

In various embodiments, the wetting layer 150 can be made of III-V semiconductor materials, for example, aluminum arsenide (AlAs) or indium phosphide (InP). The wetting material can be selected based on the ability to deposit on {111} crystal faces of the exposed sidewalls 122 of the fin mandrels. The crystal lattice of the wetting material may not be matched to the {111} crystal faces of the sidewalls 122.

In various embodiments, the wetting layer 150 can have a thickness on the sidewalls of the fin mandrels 120 in the range of about 1 nm to about 10 nm, or in the range of about 1 nm to about 2 nm, or in the range of about 5 nm to about 7 nm, where the wetting layer is sufficiently thick to completely cover each the sidewalls 122 of the fin mandrels 120.

Figure 4:
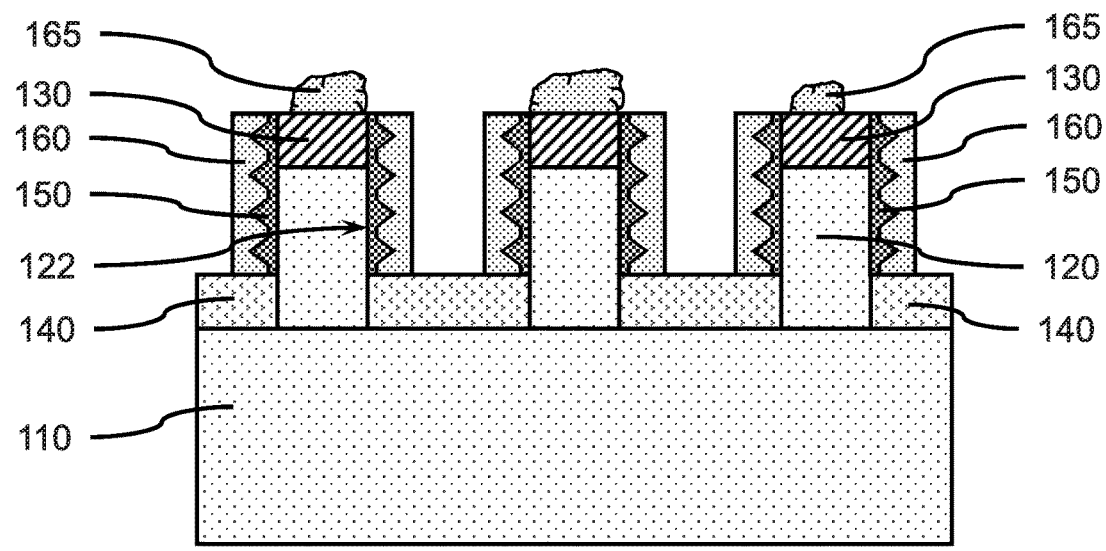
FIG. 4 is a cross-sectional side view showing a fin layer formed on the wetting layers on each of the fin mandrels and mandrel templates, in accordance with an embodiment of the present invention.

FIG. 4 is a cross-sectional side view showing a fin layer formed on the wetting layers on each of the fin mandrels and mandrel templates, in accordance with an embodiment of the present invention.

In one or more embodiments, a fin layer 160 can be formed on each of the wetting layers 150, where the fin layer 160 can be a binary or ternary III-V semiconductor material. The fin layer can be formed by a heteroepitaxial growth process, where the fin layer 160 can grow laterally on the wetting layer 150 from the sidewalls of the fin mandrel 120. The fin layer 160 can be formed by a metal-organic chemical vapor deposition (MOCVD) or atomic layer deposition/ atomic layer epitaxy (ALD/ALE). In various embodiments, the fin layer 160 forms on the wetting layers 150 without forming on the exposed top surface of the spacer layer 140. Fin layer islands 165 can form on the tops surfaces of the mandrel templates 130, for example, when the mandrel templates 130 are silicon nitride (SiN), from extraneous material forming the fin layer 160. The fin layer islands 165 can be randomly oriented single crystals or polycrystalline deposits of the III-V fin layer material.

In various embodiments, the fin layer 160 can be made of a binary or tertiary III-V semiconductor material, including, but not limited to, indium phosphide (InP), indium arsenide (InAs), indium-gallium-arsenide (InGaAs), and combinations thereof (e.g., multilayers, heterostructures).

In various embodiments, the fin layer 160 can be grown to a thickness in the range of about 10 nm to about 35 nm, or in the range of about 10 nm to about 30 nm, or in the range of about 15 nm to about 25 nm, where the smoothness of the exposed surface of the fin layer can improve with increasing thickness.

Figure 5:
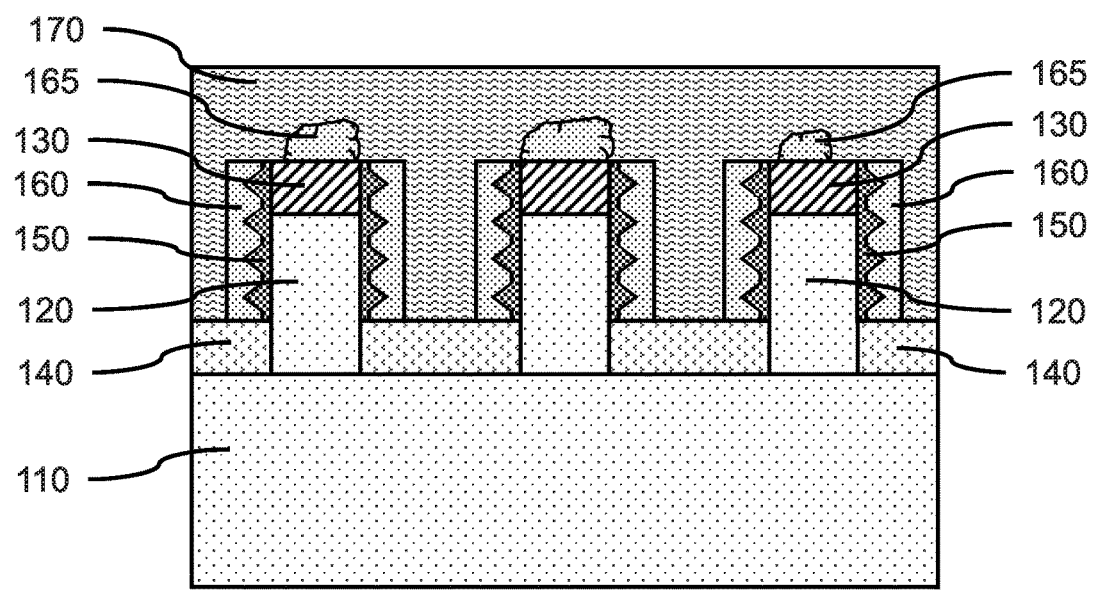
FIG. 5 is a cross-sectional side view showing a fill layer on the fin layers and mandrel templates, in accordance with an embodiment of the present invention.

FIG. 5 is a cross-sectional side view showing a fill layer on the fin layers and mandrel templates, in accordance with an embodiment of the present invention.

In one or more embodiments, a fill layer 170 can be formed on the fin layers 160, wetting layers 150, fin layer islands 165, exposed portions of the mandrel templates 130, and exposed portions of the spacer layer 140.

In various embodiments, the fill layer 170 can be made of amorphous silicon (a-Si), amorphous carbon (a-C), a flowable oxide (e.g. polymeric silicon oxides (SiO), for example, HSQ), a spin-on-glass, or an organic resist material/organic planarization material. In various embodiments, a fill layer 170 made of a flowable oxide may be densified. The fill layer 170 can be formed to a height that covers the tops of the extraneous fin layer islands 165. The top surface of the fill layer 170 can be chemically-mechanically polished to provide a smooth, flat surface.

Figure 6:
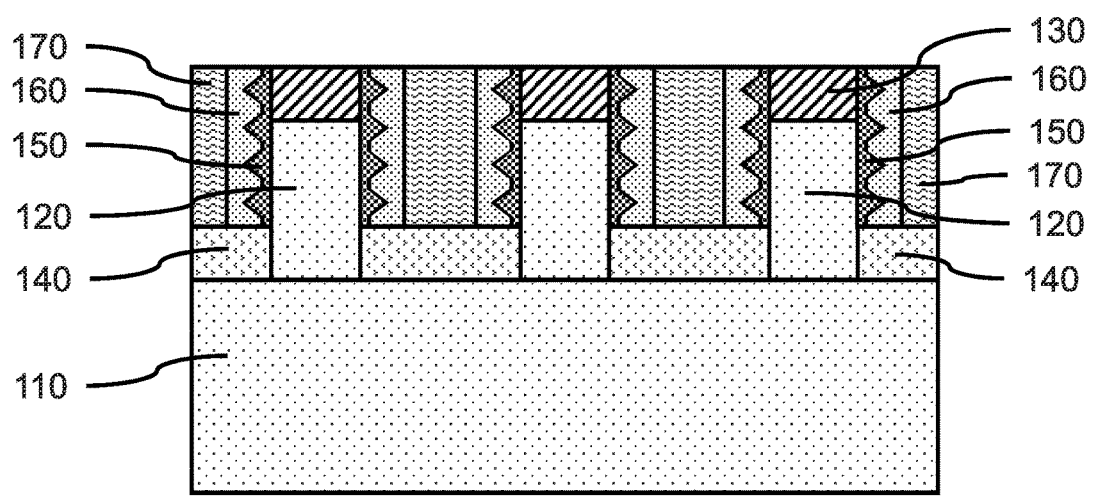
FIG. 6 is a cross-sectional side view showing removal of extraneous fin layer islands from the top surface of the mandrel templates, in accordance with an embodiment of the present invention.

FIG. 6 is a cross-sectional side view showing removal of extraneous fin layer islands from the top surface of the mandrel templates, in accordance with an embodiment of the present invention.

In one or more embodiments, an upper portion of the fill layer 170 and the fin layer islands 165 can be removed, where the upper portion of the fill layer 170 and the fin layer islands 165 can be removed by a chemical-mechanical polishing (CMP). The top surface of the mandrel templates 130 can be exposed after the CMP.

Figure 7:
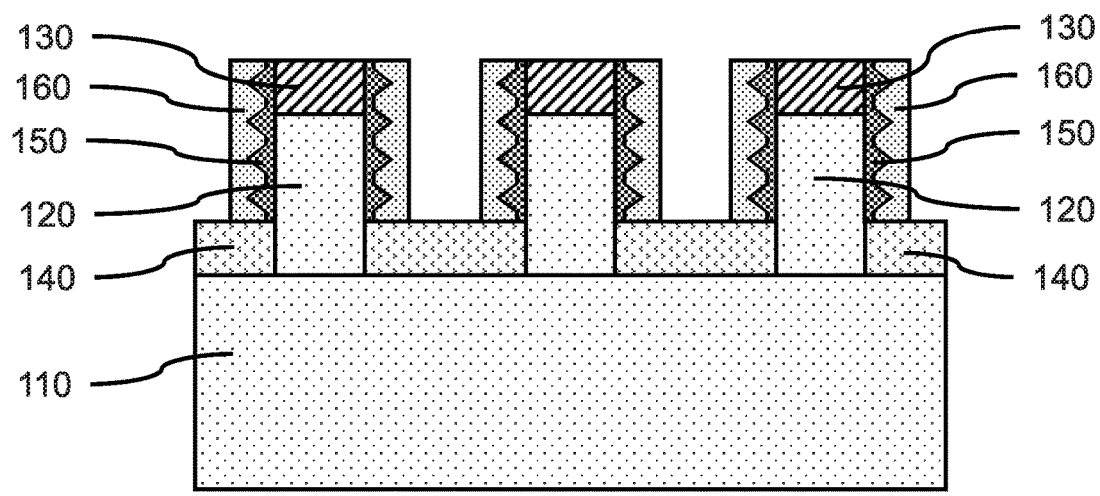
FIG. 7 is a cross-sectional side view showing the fin layers, wetting layers, fin templates, and spacer layer after removing the fill layer, in accordance with an embodiment of the present invention.

FIG. 7 is a cross-sectional side view showing the fin layers, wetting layers, fin templates, and spacer layer after removing the fill layer, in accordance with an embodiment of the present invention.

In one or more embodiments, the fill layer 170 can be removed after the CMP to re-expose portions of the fin layers 160, wetting layers 150, fin templates 130, and spacer layer 140, where the fill layer 170 can be removed using a selective etch.

Figure 8:
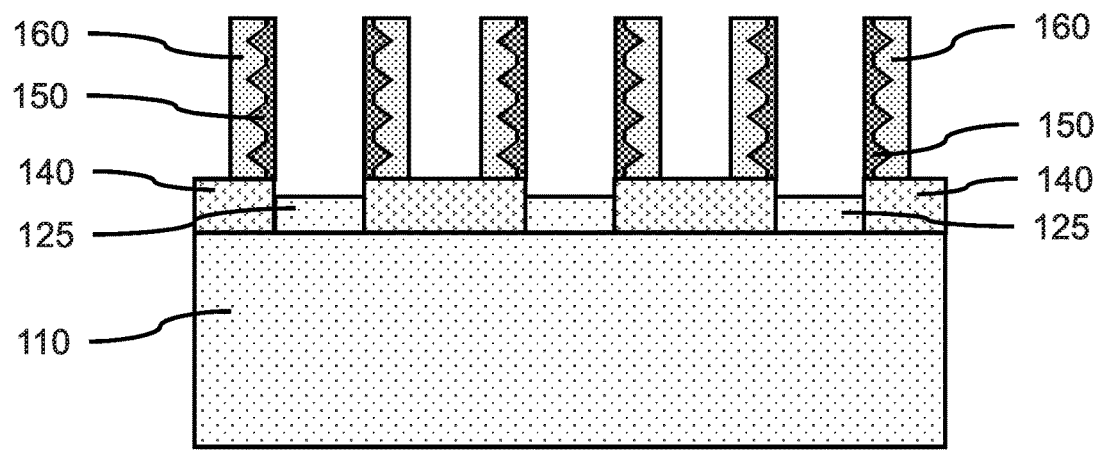
FIG. 8 is a cross-sectional side view showing the fin layers and wetting layers on the spacer layer after removing the fin templates and reducing the height of the fin mandrels, in accordance with an embodiment of the present invention.

FIG. 8 is a cross-sectional side view showing the fin layers and wetting layers on the spacer layer after removing the fin templates and reducing the height of the fin mandrels, in accordance with an embodiment of the present invention.

In one or more embodiments, the fin templates 130 can be removed from the top surfaces of the fin mandrels 120, where the fin templates 130 can be removed using a selective wet or dry etch, for example, RIE, dry plasma etch, basic oxide etch (BOE), phosphoric acid, etc.

In one or more embodiments, the height of the fin mandrels 120 can be reduced to form fin mandrel slabs 125, where the height of the fin mandrels can be reduced to expose the sidewalls of the wetting layers 150. The height of the fin mandrels 120 can be reduced below the top surfaces of the spacer layer 140, such that the entire sidewall of the wetting layers 150 are exposed. The top surfaces of the fin mandrel slabs can be less than the height of the spacer layer 140. The height of the fin mandrels 120 can be reduced using a selective wet or dry etch. The spacer layer 140 can support the fin layers 160 and wetting layers 150 after removal of the fin mandrels from the wetting layers.

Figure 9:
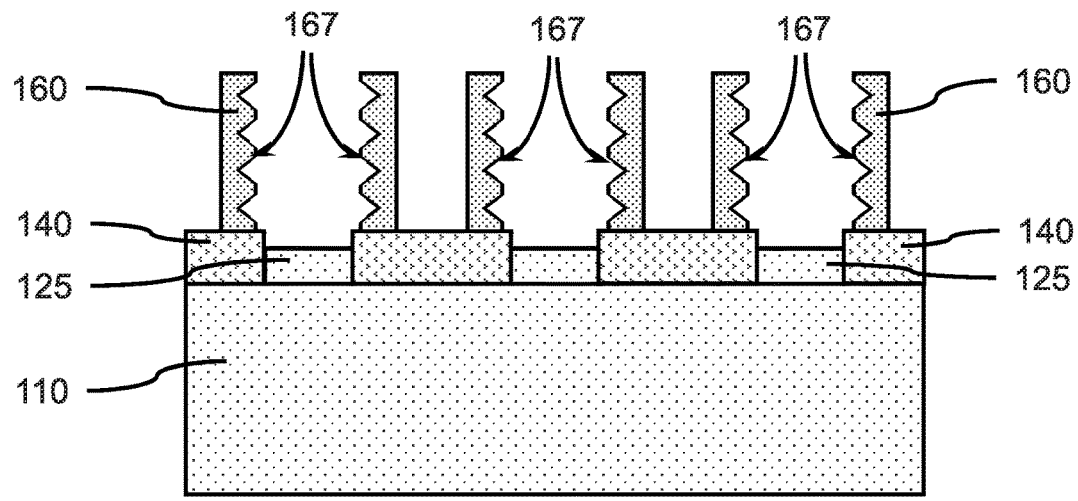
FIG. 9 is a cross-sectional side view showing the fin layers after removing the wetting layers, in accordance with an embodiment of the present invention.

FIG. 9 is a cross-sectional side view showing the fin layers after removing the wetting layers, in accordance with an embodiment of the present invention.

In one or more embodiments, the wetting layers 150 can be removed to expose the rough sidewalls 167 of the fin layers 160. The wetting layers 150 can be removed using a wet chemical etch, for example, hydrochloric acid (HCl) etch or ammonium hydroxide ($NH_4OH$) etch. In various embodiments, the wetting layers 150 and fin mandrels 120 can be etched at the same time. A dry plasma etch or hydrogen fluoride (HF) etch may not be used.

Figure 10:
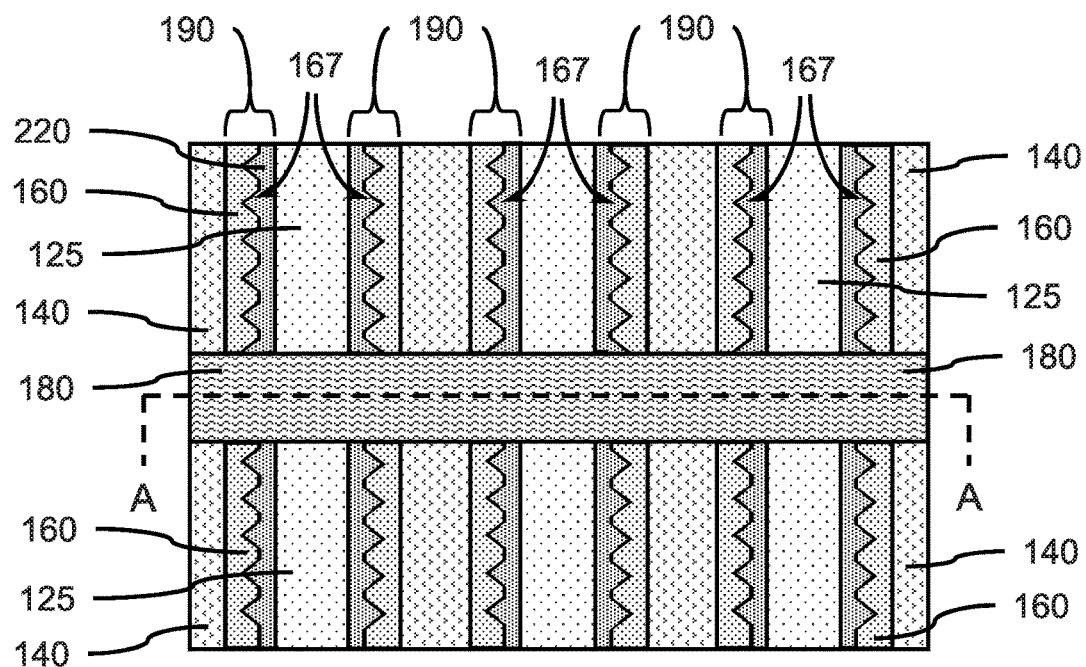
FIG. 10 is a top view showing the dummy gate layer formed on a middle section of the fin layers, and fin layer regrowth on the rough sidewalls of the fin layers, in accordance with an embodiment of the present invention.

FIG. 10 is a top view showing the dummy gate layer formed on a middle section of the fin layers, and fin layer regrowth on the rough sidewalls of the fin layers, in accordance with an embodiment of the present invention.

In one or more embodiments, a dummy gate layer 180 can be formed across a central portion of one or more of the fin layers 160. The fin layers 160 can be masked, and a trench formed in the mask over a predetermined portion of the fin layers, where the dummy gate layer 180 can be formed across a central portion of one or more of the fin layers 160.

In various embodiments, the dummy gate layer 180 can define a gate length of a subsequently formed gate structure on the vertical fins. The dummy gate layer 180 can have a width in the range of about 10 nm to about 1 μm, or in the range of about 20 nm to about 100 nm, or in the range of about 10 nm to about 70 nm, or in the range of about 10 nm to about 30 nm.

In various embodiments, the dummy gate layer 180 can be made of a material, including, but not limited to, amorphous silicon (a-Si), amorphous carbon (a-C), silicon-germanium (SiGe), flowable oxide, or silicon nitride (SiN). The material of the dummy gate 180 can selectively etchable relative to the spacer layer 140 and subsequently formed cover layers, or the material of the dummy gate and spacer layer can be the same.

In one or more embodiments, fin layer regrowth 220 can be formed on the exposed rough sidewalls 167 of the fin layers 160, where the fin layer regrowth 220 can be formed by epitaxial growth. The fin layer 160 and fin layer regrowth 220 can form the two components of a vertical fin 190. The fin layer regrowth 220 can be formed on the exposed rough sidewalls 167 of the fin layers 160 before or after the dummy gate layer is formed. The fin layer regrowth 220 can be the same III-V semiconductor material as the fin layer 160 III-V semiconductor material.

Figure 11:
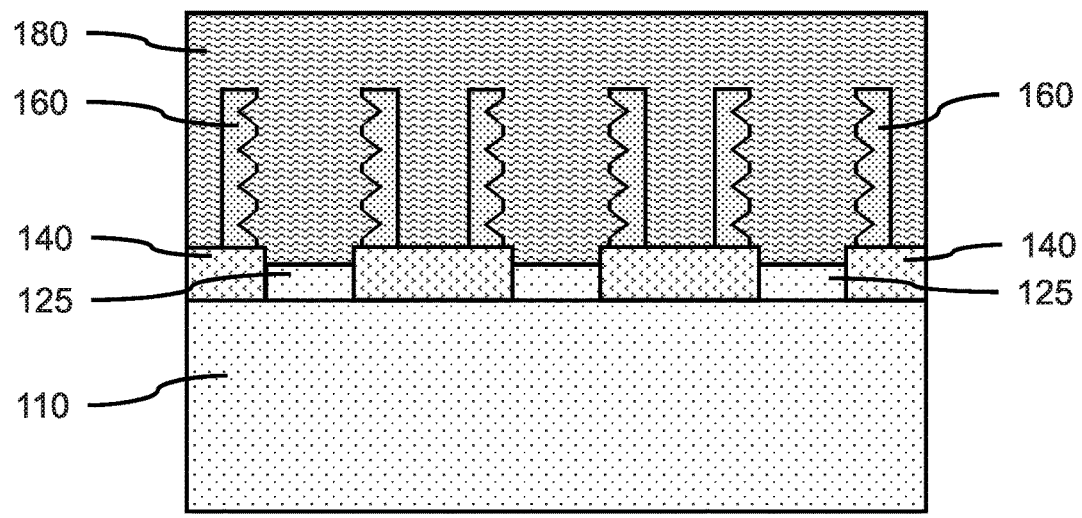
FIG. 11 is a cross-sectional side view showing the dummy gate layer formed on a portion of the fin layers along the A-A cutting plane of FIG. 10, in accordance with an embodiment of the present invention.

FIG. 11 is a cross-sectional side view showing the dummy gate layer formed on a portion of the fin layers along the A-A cutting plane of FIG. 10, in accordance with an embodiment of the present invention.

In one or more embodiments, the dummy gate layer 180 can extend above the top surfaces of the fin layers 160, and fill in the shallow area over the fin mandrel slabs 125. The mask material can be removed after formation of the dummy gate layer 180.

Figure 12:
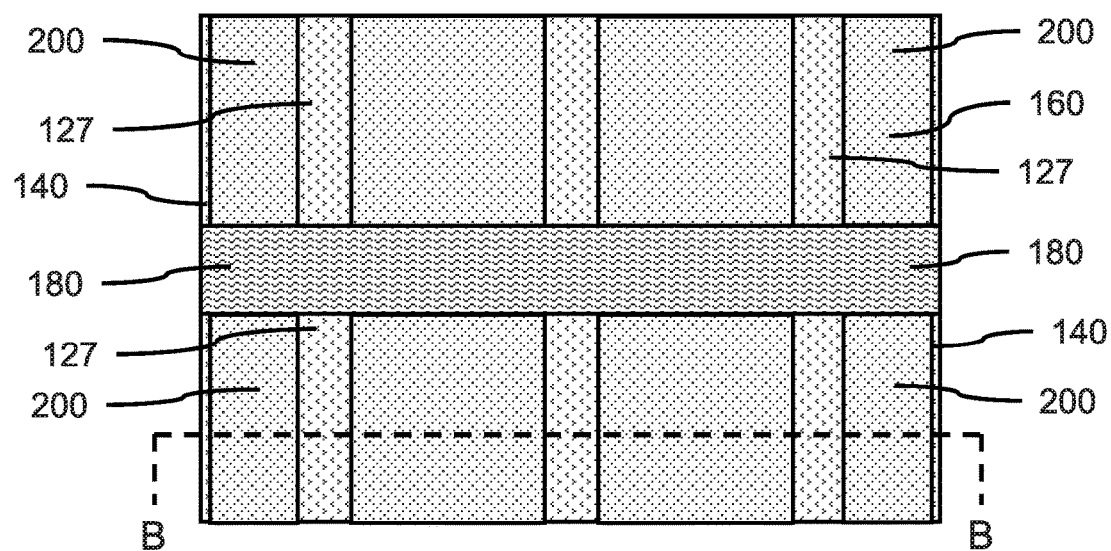
FIG. 12 is a top view showing source/drains formed on the fin layers and fin layer regrowth on opposite sides of the dummy gate layer, in accordance with an embodiment of the present invention.

FIG. 12 is a top view showing source/drains formed on the fin layers and fin layer regrowth on opposite sides of the dummy gate layer, in accordance with an embodiment of the present invention.

In one or more embodiments, source/drains 200 can be formed on opposite sides of the dummy gate layer 180 on the exposed portions of the fin layers 160 and fin layer regrowth 220 forming the vertical fins 190. The source/drains 200 can be formed by epitaxial growth on the exposed surfaces of the vertical fins 190 adjacent to the dummy gate layer 180. The epitaxial growth can be terminated before the source/drains 200 merge across all the fin layers 160, or the source/drains 200 can grow laterally until source/drains 200 on adjacent fin layers merge. Sections of the fin mandrel slabs 125 can be exposed between adjacent, unmerged, source/drains 200. Merged source/drains can cover the fin mandrel slabs 125 and prevent shorting and substrate leakage from metal contacts.

In various embodiments, the source/drains 200 can be made of the same material as the fin layers 160 and fin layer regrowths 220, where the source/drains are formed by epitaxial growth on single crystal fin layers 160 and fin layer regrowths 220. In various embodiments, a layer of InAs can be formed on the source/drains 200 to improve electrical contact.

In various embodiments, the source/drains can be doped with an n-type dopant to form an N-type fin field effect transistor (FinFET).

Figure 13:
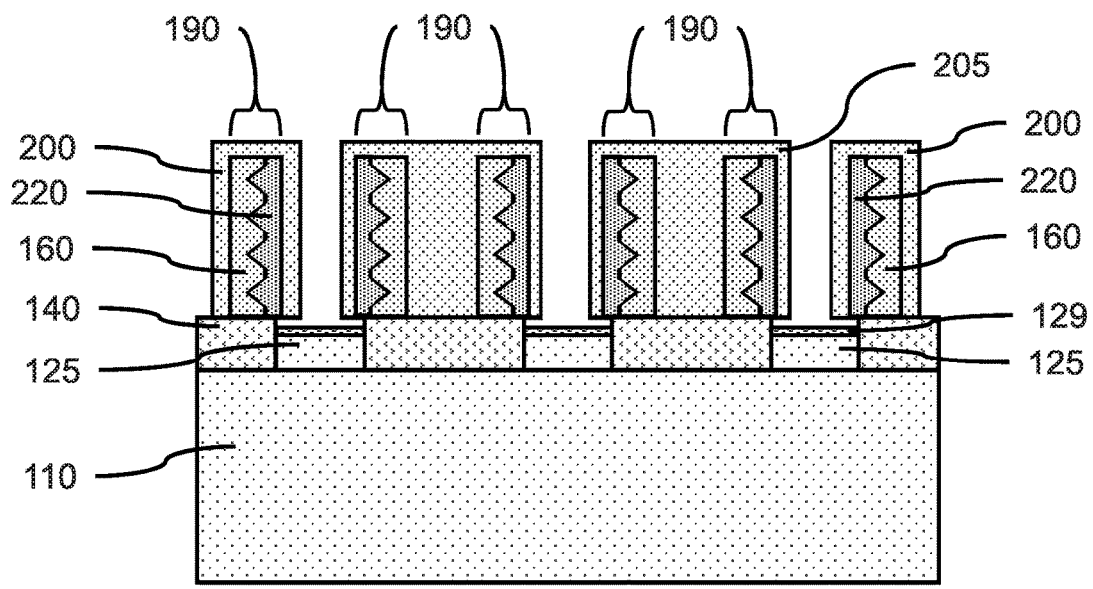
FIG. 13 is a cross-sectional side view showing source/drains on the fin layers and fin layer regrowths along the B-B cutting plane of FIG. 12, in accordance with an embodiment of the present invention.

FIG. 13 is a cross-sectional side view showing source/drains on the fin layers and fin layer regrowths along the B-B cutting plane of FIG. 12, in accordance with an embodiment of the present invention.

In one or more embodiments, a source/drain 200 can be formed on three sides of one or more adjacent fin layers 160 and fin layer regrowths 220, where the source/drain 200 can grow from the exposed surfaces of the fin layer 160. The source/drain 200 can overhang an edge of the spacer layer, where a portion of the bottom surface of the source/drain can be exposed. Adjacent source/drains 200 can grow to a size at which they merge into a single source/drain 200 spanning two or more adjacent fin layers 160 and fin layer regrowths 220 forming the vertical fins. There can be a gap between the merged source/drain 200 and top surface of the fin mandrel slab 125.

In various embodiments, an oxide layer 129 can form on the fin mandrel slabs 125, where the oxide layer 129 can be a native oxide layer (e.g., silicon oxide (SiO)) formed from the fin mandrel slab material. The oxide layer 129 can be thinner than the depth of the gap between the bottom surface of the source/drains 200 or merged source/drain 200 and the top surface of the fin mandrel slab 125, so there can still be a gap between the merged source/drain 200 and surface of the oxide layer 129, or the oxide layer can be sufficiently thick to fill the gap. A native oxide layer can remain, since a hydrogen fluoride (HF) etch may not be used. The oxide layer 129 can prevent formation of the III-V fin layer regrowth 220 on the fin mandrel slabs 125.

Figure 14:
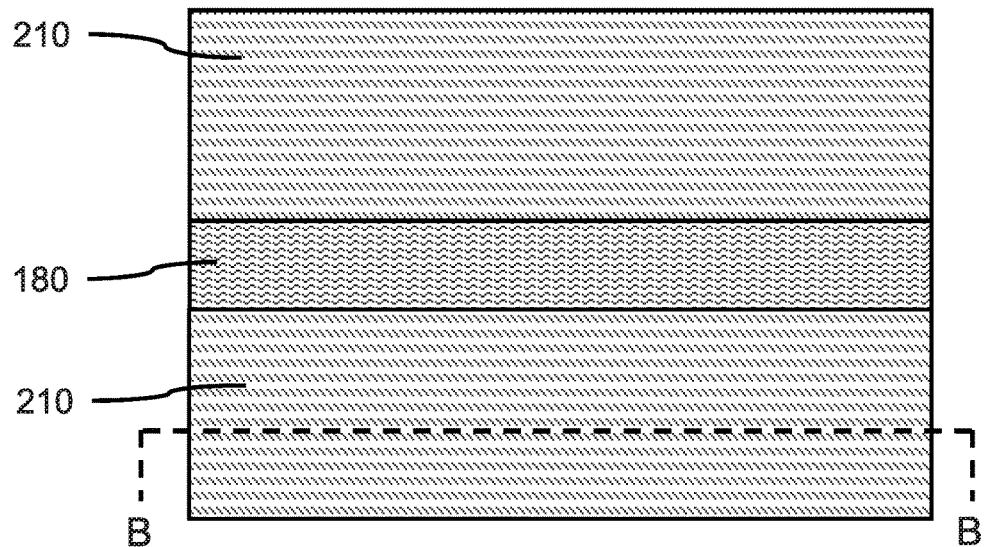
FIG. 14 is a top view showing cover layers formed on the source/drains on opposite sides of the dummy gate layer, in accordance with an embodiment of the present invention.

FIG. 14 is a top view showing cover layers formed on the source/drains on opposite sides of the dummy gate layer, in accordance with an embodiment of the present invention.

In one or more embodiments, a cover layer 210 can be formed over the source/drains 200 and the fin mandrel slabs 125, where the cover layer can fill in the gaps between the source/drains 200. The cover layer can be a dielectric material that physically and electrically isolates adjacent source/drains 200. The cover layer can be formed by CVD, a spin-on process, or HDP. The dummy gate material can be selectively etchable relative to the cover layer 210.

In various embodiments, the cover layer 210 can be flowable oxide, silicon oxide (SiO), silicon nitride (SiN), or a combination thereof. A CMP can be used to remove excess cover layer 210 and planarize the cover layer 210 at the level of the top of the dummy gate layer 180.

Figure 15:
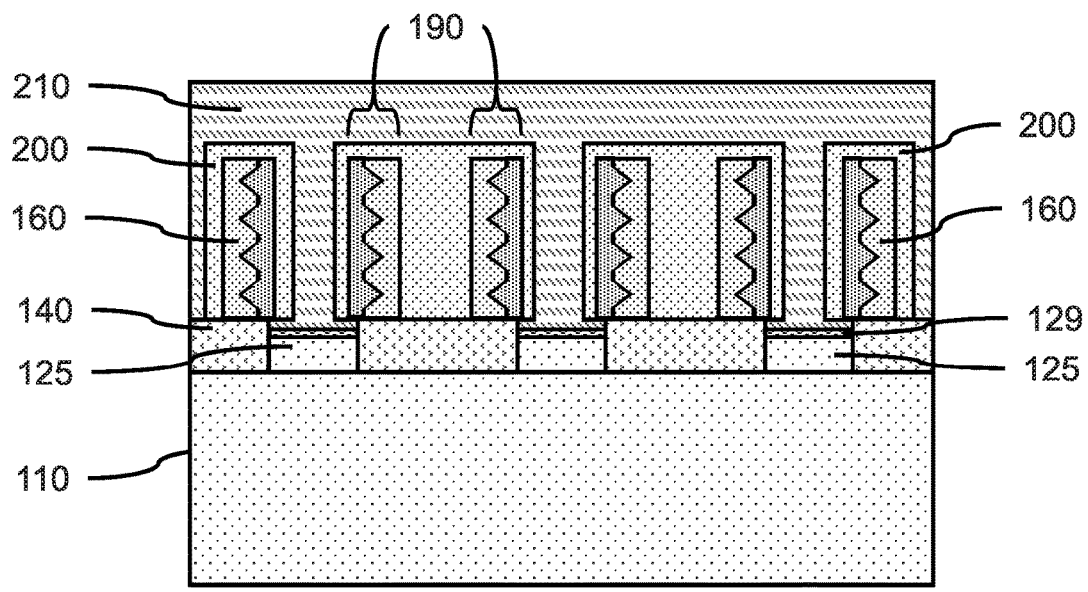
FIG. 15 is a cross-sectional side view showing the cover layer on the source/drains along the B-B cutting plane of FIG. 14, in accordance with an embodiment of the present invention.

FIG. 15 is a cross-sectional side view showing the cover layer on the source/drains along the B-B cutting plane of FIG. 14, in accordance with an embodiment of the present invention.

In various embodiments, the cover layer 210 can extend above the top surfaces of the source/drains 200 and fill in the gaps between the source/drains.

Figure 16:
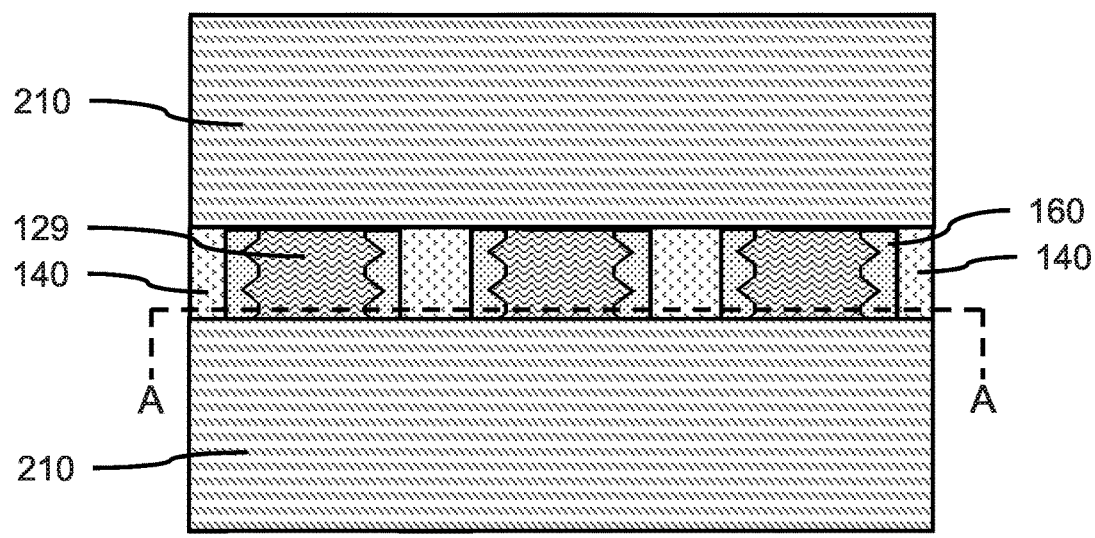
FIG. 16 is a top view showing the fin layers and an oxide layer exposed after removing the dummy gate layer from between the cover layers, in accordance with an embodiment of the present invention.

FIG. 16 is a top view showing the fin layers and an oxide layer exposed after removing the dummy gate layer from between the cover layers, in accordance with an embodiment of the present invention.

In one or more embodiments, the dummy gate layer 180 can be removed, where the dummy gate layer can be removed using a selective isotropic etch (e.g., a wet chemical etch). Removal of the dummy gate layer can expose the central portion of the fin layers 160, spacer layer 140, and oxide layer 129 on fin mandrel slabs 125, between the source/drains 200 and the cover layers 210.

Figure 17:
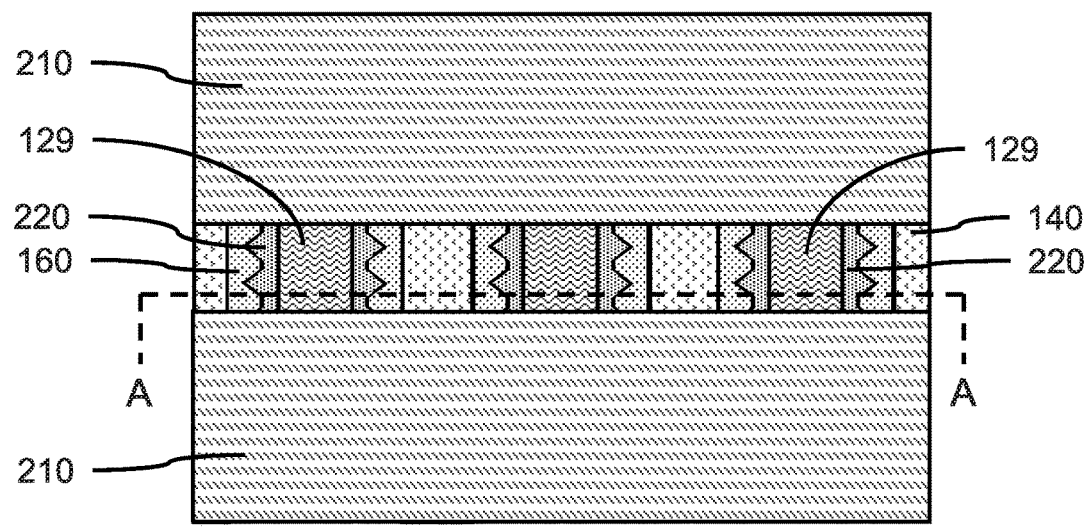
FIG. 17 is a top view showing the fin layer regrowth on the middle section of the fin layers to form a plurality of vertical fins on the spacer layer, in accordance with an embodiment of the present invention.

FIG. 17 is a top view showing the fin layer regrowth on the middle section of the fin layers to form a plurality of vertical fins on the spacer layer, in accordance with an embodiment of the present invention.

In one or more embodiments, fin layer regrowth 220 can be formed on the exposed rough surfaces of the fin layers 160, where the fin layer regrowth 220 can be formed by epitaxial growth. The fin layer regrowth 220 can be the same III-V semiconductor material as the fin layer 160 III-V semiconductor material.

The fin layer 160 and fin layer regrowth 220 can form the two components of a vertical fin 190, where the fin layer regrowth 220 formed on the fin layer 160 exposed by removing the dummy gate layer 180 can be in physical and electrical contact with the fin layer regrowth 220 under the source/drains 200.

Figure 18:
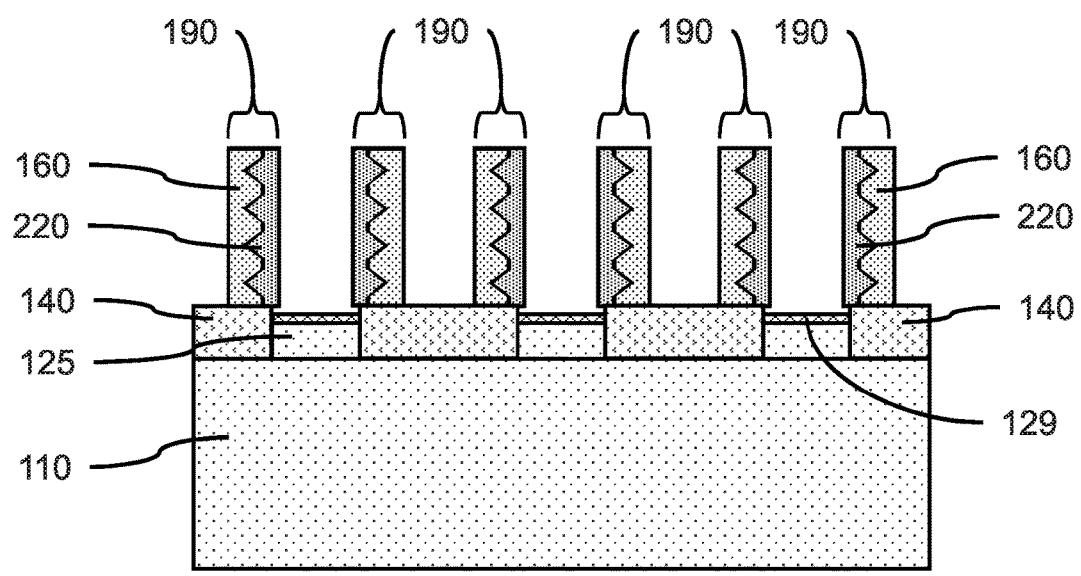
FIG. 18 is a cross-sectional side view showing the fin layer regrowth on the middle section of the fin layers along the A-A cutting plane of FIG. 17, in accordance with an embodiment of the present invention.

FIG. 18 is a cross-sectional side view showing the fin layer regrowth on the fin layers along the A-A cutting plane of FIG. 17, in accordance with an embodiment of the present invention.

In one or more embodiments, the fin regrowth layer 220 can have a thickness in the range of about 6 nm to about 25 nm, or in the range of about 10 nm to about 20 nm, where the thickness of the fin regrowth layer 220 is sufficient to cover the rough surface 167 and reduce the roughness of the exposed surfaces of the vertical fins 190.

In various embodiments, the oxide layer 129 can be formed on the fin mandrel slabs 125, where the oxide layer 129 can be a native oxide that formed on the fin mandrel slabs 125 during processing. The oxide layer 129 can be thinner than the depth of the gap between the bottom surface of the source/drains 200 or merged source/drain 200 and the top surface of the fin mandrel slab 125, so there can still be a gap between the fin regrowth layer 220 and surface of the oxide layer 129, or the oxide layer can be sufficiently thick to fill the gap. The oxide layer 129 can prevent formation of the III-V fin layer regrowth 220 on the fin mandrel slabs 125.

In one or more embodiments, the width of the vertical fin 190 can be reduced using a digital etch, where the III-V semiconductor structure can be thinned using a two-step plasma oxidation and acid etch.

Figure 19:
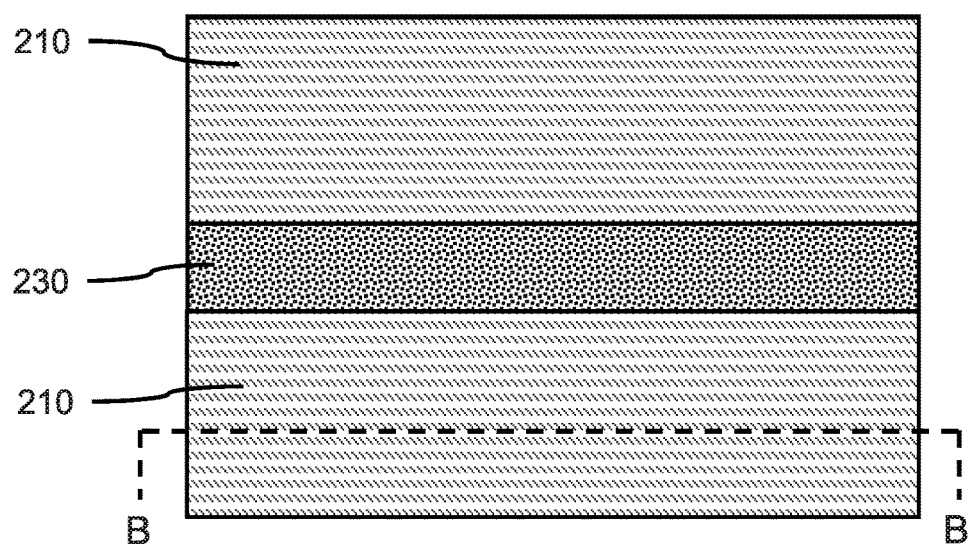
FIG. 19 is a top view showing a gate structure formed on the middle section of the vertical fins, in accordance with an embodiment of the present invention.

FIG. 19 is a top view showing a gate structure formed on the middle section of the vertical fins, in accordance with an embodiment of the present invention.

In one or more embodiments, a gate structure can be formed on the vertical fins formed by the fin layer 160 and fin regrowth layer 220 forming the vertical fins 190. The gate structure can be formed by depositing a gate dielectric layer on the exposed portions of the vertical fins 190, depositing a work metal layer on the gate dielectric layer, and depositing a conductive gate fill 230 on the work function layer. A CMP can be used to remove excess conductive gate fill 230 and planarize the conductive gate fill at the level of the top of the cover layers 210.

In various embodiments, electrical contacts can be formed to the source/drains 200 and the gate structure.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a III-V semiconductor vertical fin, comprising:
   forming a fin mandrel on a substrate;
   forming a spacer layer on the substrate surrounding the fin mandrel;
   forming a wetting layer on each of the sidewalls of the fin mandrel;
   forming a fin layer on each of the wetting layers;
   removing the fin mandrel;
   removing the wetting layer on each of the fin layers; and
   forming a fin layer regrowth on each of the sidewalls of the fin layers exposed by removing the wetting layer from each of the fin layers.

2. The method of claim 1, wherein the wetting layers are made of aluminum arsenide (AlAs) or indium phosphide (InP).

3. The method of claim 2, wherein the wetting layers are formed by metal-organic chemical vapor deposition (MOCVD) or atomic layer deposition/atomic layer epitaxy (ALD/ALE).

4. The method of claim 1, wherein the fin layers are a III-V semiconductor material.

5. The method of claim 4, wherein the material of the fin layers are selected from the group consisting of indium phosphide (InP), indium arsenide (InAs), indium-gallium-arsenide (InGaAs), and combinations thereof.

6. The method of claim 5, wherein the fin layers are formed by metal-organic chemical vapor deposition (MOCVD) or atomic layer deposition/atomic layer epitaxy (ALD/ALE).

7. The method of claim 6, wherein the fin mandrel is made of single crystal silicon, and the wetting layer is formed on a {111} crystal face of the fin mandrel.

8. The method of claim 6, wherein the fin layer regrowths are made of the same material as the fin layers.

9. The method of claim 6, wherein the fin layer regrowths have a thickness in the range of about 6 nm to about 25 nm.

10. A method of forming a III-V semiconductor vertical fin, comprising:
    forming a fin mandrel on a substrate;
    forming a spacer layer on the substrate surrounding the fin mandrel;
    forming a wetting layer on each of the sidewalls of the fin mandrel;
    forming a fin layer on each of the wetting layers, where the fin layer is a binary or ternary III-V semiconductor material;
    removing the fin mandrel;
    removing the wetting layer on each of the fin layers;
    forming a fin layer regrowth on each of the sidewalls of the fin layers exposed by removing the wetting layer from each of the fin layers; and
    forming a dummy gate layer over a middle section of a vertical fin including the fin layer regrowth and the fin layer.

11. The method of claim 10, wherein the material of the fin layers are selected from the group consisting of indium phosphide (InP), indium arsenide (InAs), indium-gallium-arsenide (InGaAs), and combinations thereof.

12. The method of claim 11, wherein the fin mandrel is made of single crystal silicon, and the wetting layer is formed on a {111} crystal face of the fin mandrel.

13. The method of claim 12, further comprising forming a source/drain on the opposite sides of the dummy gate layer on the exposed portions of the fin layer and fin layer regrowth forming the vertical fin.

14. The method of claim 13, wherein the source/drain on each of the opposite sides of the dummy gate layer are made of the same III-V semiconductor material as the fin layers.

15. The method of claim 14, further comprising removing the dummy gate layer, and forming a gate structure over the middle section of the vertical fin.

* * * * *